United States Patent
Chu et al.

(10) Patent No.: US 11,079,723 B2
(45) Date of Patent: Aug. 3, 2021

(54) APPARATUS AND METHODS FOR AUTOMATIC TIME MEASUREMENTS

(71) Applicant: Integrated Device Technology, Inc., San Jose, CA (US)

(72) Inventors: Min Chu, Milpitas, CA (US); Jagdeep Singh Bal, Saratoga, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 737 days.

(21) Appl. No.: 15/889,737

(22) Filed: Feb. 6, 2018

(65) Prior Publication Data

US 2019/0243312 A1 Aug. 8, 2019

(51) Int. Cl.

| | |
|---|---|
| *G04F 10/00* | (2006.01) |
| *H03K 3/03* | (2006.01) |
| *H03K 5/159* | (2006.01) |
| *H03K 5/135* | (2006.01) |
| *G04F 10/02* | (2006.01) |
| *H03K 21/38* | (2006.01) |
| *H03K 5/00* | (2006.01) |

(52) U.S. Cl.
CPC ............ *G04F 10/005* (2013.01); *G04F 10/02* (2013.01); *H03K 3/0315* (2013.01); *H03K 5/135* (2013.01); *H03K 5/159* (2013.01); *H03K 21/38* (2013.01); *H03K 2005/00156* (2013.01)

(58) Field of Classification Search
CPC . H03M 1/0836; H03M 1/0854; G04F 10/005; G04F 10/02; H03K 3/0315; H03K 5/159; H03K 5/135; H03K 21/38; H03K 2005/00156

USPC ......... 702/89, 78, 79, 125; 326/37; 340/527; 331/57, 1 A; 327/158, 161; 368/113; 324/6.82

See application file for complete search history.

(56) References Cited

U.S. PATENT DOCUMENTS

| | | |
|---|---|---|
| 5,309,212 A | 5/1994 | Clark |
| 8,138,843 B2 | 3/2012 | Straayer et al. |
| 9,383,200 B2 | 7/2016 | Hulm et al. |
| 2005/0211893 A1* | 9/2005 | Paschalidis ............. G04F 10/00 250/287 |
| 2009/0072812 A1* | 3/2009 | Henzler ................ G04F 10/005 324/76.82 |
| 2014/0333358 A1 | 11/2014 | Kim et al. |
| 2016/0269036 A1 | 9/2016 | Familia et al. |
| 2017/0214407 A1 | 7/2017 | Kianush et al. |
| 2017/0244544 A1 | 8/2017 | Galton et al. |

(Continued)

OTHER PUBLICATIONS

Matthew Z. Straayer et al. "A Multi-Path Gated Ring Oscillator TDC With First-Order Noise Shaping," IEEE Journal of Solid-State Circuits, vol. 44, No. 4, Apr. 2009. 10 Pages.

(Continued)

*Primary Examiner* — Arnold M Kinkead
(74) *Attorney, Agent, or Firm* — Haynes and Boone, LLP

(57) ABSTRACT

A time-to-digital converter obtains a Start signal to indicate the start of an event, and a Stop signal whose assertion indicates the stop of the event. The Stop signal can be asserted multiple times due to false indications of the event stop. The TDC continuously monitors the Stop signal to generate a separate digital value for the duration from the event's starting time to each assertion of the Stop signal. The digital values can be analyzed to select the true duration of the event. Other features and embodiments are also provided.

20 Claims, 13 Drawing Sheets

(56) References Cited

U.S. PATENT DOCUMENTS

| | | |
|---|---|---|
| 2017/0269197 A1 | 9/2017 | Hall et al. |
| 2017/0269213 A1 | 9/2017 | Luthi et al. |
| 2017/0293021 A1 | 10/2017 | Franzreb et al. |
| 2017/0315238 A1 | 11/2017 | Nagai |
| 2017/0366193 A1 | 12/2017 | Matsumura |
| 2017/0373697 A1 | 12/2017 | Schober et al. |
| 2017/0373826 A1 | 12/2017 | Travis |
| 2018/0013437 A1 | 1/2018 | Zhou et al. |
| 2018/0013438 A1 | 1/2018 | Zerbe et al. |
| 2018/0267481 A1* | 9/2018 | Kondo ............... G01S 7/285 |
| 2020/0212916 A1* | 7/2020 | Moe ............... H03L 7/0812 |

OTHER PUBLICATIONS

Shahrzad Naraghi, "Time-Based Analog to Digital Converters." A Dissertation Submitted in Partial Fulfillment of the Requirements for the Degree of Doctor of Philosophy (Electrical Engineering) in the University of Michigan, 2009, https://deepblue.lib.umich.edu/bitstream/handle/2027.42/64787/naraghi_1.pdf?sequence=1. 118 Pages.

Qi Zhong et al. "A High Precision TDC Based on a Multi-Phase Clock," School of Nuclear Science and Technology, Lanzhou University, Lanzhou 730000, China. 8 Pages.

Jianjun Yu et al. "A 12-Bit Vernier Ring Time-to-Digital Converter in 0.13 um CMOS Technology," IEEE Journal of Solid-State Circuits, vol. 45, No. 4, Apr. 2010. 13 Pages.

S. Henzler, "Time-to-Digital Converters," Spring Series in Advanced Microelectronics 29; Chapter 2: Time-to-Digital Converter Basics, Springer Science + Business Media B.V. 2010. 15 Pages.

U.S. Appl. No. 15/849,412 titled "Use of Ring Oscillators for Multi-Stop Time Measurements," filed Dec. 20, 2017.

Sami Kurtti, "Integrated Receiver Channel and Timing Discrimination Circuits for a Pulsed Time-of-Flight Laser Rangefinder." University of Oulu Graduate School; University of Oulu, Faculty of Technology, Department of Electrical Engineering, Oulu, Finland. 104 Pages.

Markus-Christian Amann et al. "Laser Ranging: A Critical Review of Usual Techniques for Distance Measurements." Society of Photo-Optical Instrumentation Engineers, Jan. 2001. 10 Pages.

Qicong Wang et al. "Range Clusters Based Time-of-Flight 3D Imaging Obstacle Detection in Manifold Space." Department of Computer Science, Xiamen University, Xiamen 361005, Fujian, China. Optical Society of America, 2014. 13 Pages.

"Texas Instruments," Schematics. Texas Instruments, Block Diagram, 2016. 6 Pages.

\* cited by examiner

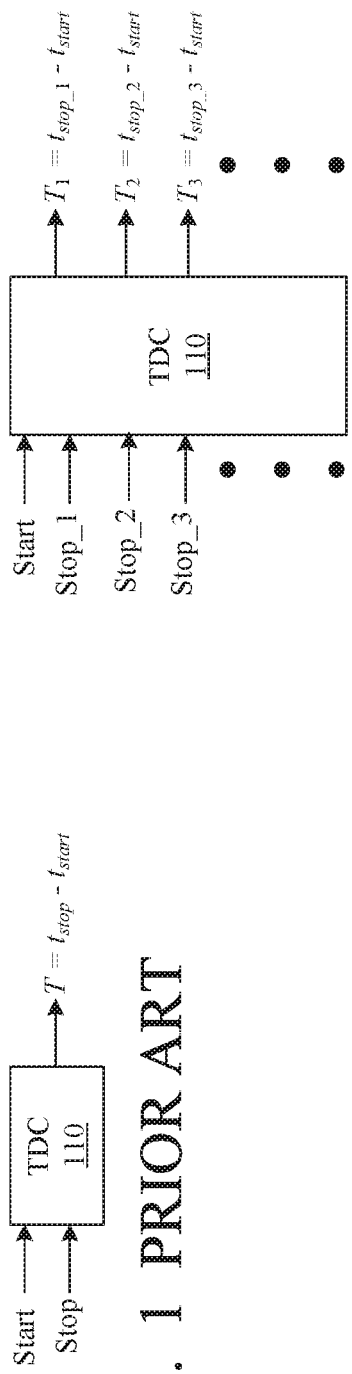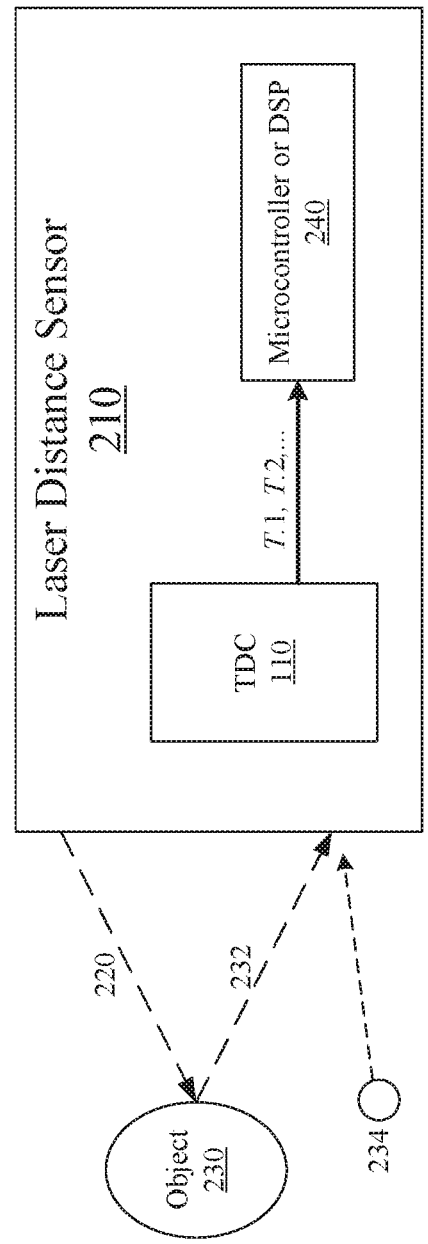

APPARATUS AND METHODS FOR AUTOMATIC TIME MEASUREMENTS

BACKGROUND OF THE INVENTION

The present invention relates to automatic time measurements, e.g. Time of Flight (TOF) measurements or other time measurements, such as performed by LIDARs (light detection and ranging devices), self-driving cars, drones, phase-locked loops, mass spectrometers, and other automatic equipment.

Time measurements are widely used to measure distances, signal phase differences, and masses. For example, a robot can determine the distance to an object by emitting a light beam and measuring the time traveled by the light to the object and back. A phase-locked loop (PLL) can determine the phase difference between two signals by measuring the time interval between the signals crossing a threshold value. A mass spectrometer can determine composition of a sample by measuring the time that it takes a sample's ionized molecules to travel a predetermined distance in an electric field.

FIG. 1 illustrates a time measurement device 110, called "time-to-digital converter" (TDC). TDC 110 accepts a Start signal and a Stop signal. The Start signal is asserted at some time $t_{start}$ when the measured time begins, e.g. when a robot emits a light beam. The Stop signal is asserted at a later time $t_{stop}$ when the measured time ends, e.g. the robot detects the reflected light. TDC 110 outputs a digital signal $$T = t_{stop} - t_{start}$$

which represents the duration being measured.

A multi-stop TDC 110 (FIG. 2) determines durations of multiple events, all of which start at a time $t_{start}$. Different events end at possibly different times $t_{stop\_1}$, $t_{stop\_2}$, etc., as indicated by signals Stop_1, Stop_2, etc. For each event j, the TDC outputs the digital signal $T_j = t_{stop\_j} - t_{start}$ representing the event duration.

Improved TDCs are desired.

SUMMARY

This section summarizes some features of the invention. Other features may be described in the subsequent sections. The invention is defined by the appended claims, which are incorporated into this section by reference.

Embodiments of the present invention include single-stop and multi-stop TDCs having enhanced capability. For example, FIG. 3 shows a laser distance sensor (LDS) 210 using a TDC 110 for pulsed TOF operation. LDS 210 emits a laser pulse 220 towards an object 230, detects the reflected light pulse 232, and uses the TDC to determine the distance to the object. However, the reflected pulse can be confused by other, unrelated light sources 234, or other objects reflecting the emitted pulse 220, and the LDS may mistakenly trigger the TDC too late or too early in response to unrelated light.

In some embodiments of the present invention, the LDS emits a light pulse as in prior art (or in some other way), but the LDS continually analyzes the received light to possibly detect multiple light pulses, including possibly unrelated light pulses. For each received light pulse k (k=1, 2, . . . ), the LDS will generate a separate digital time signal T.k (T.1, T.2, . . . in FIG. 3). These signals T.k, together with other information on the received light pulses, can be processed by another circuit 240, possibly a microcontroller or a digital signal processor (DSP), to estimate the true distance to the object. For example, the microcontroller may select the light pulse most closely corresponding to the emitted light pulse, e.g. having the closest duration to the emitted light pulse, and/or having the closest rise and fall slopes. The corresponding time T.k can be taken as representing the true distance to the object. Other processing techniques can also be used.

Similar techniques can be used in a multi-stop TDC.

In some embodiments, a multi-stop TDC includes single-stop TDCs sharing a ring oscillator. Ring oscillator use in conventional TDCs has been described in one or more of the following documents, all of which are incorporated herein by reference:

J. Yu, F. F. Dai, and R. C. Jaeger, "A 12-Bit Vernier Ring Time-to-Digital Converter in 0.13 um CMOS Technology," IEEE J. Solid-State Circuits, vol. 45, no. 4, April 2010;

M. Z. Straayer and M. H. Perrott, "A Multi-Path Gated Ring Oscillator TDC With First-Order Noise Shaping," IEEE J. Solid-State Circuits, vol. 44, no. 4, April 2009;

Shahrzad Naraghi, "Time-Based Analog to Digital Converters", dissertation submitted in partial fulfillment of the requirements for the degree of Doctor of Philosophy (Electrical Engineering), University of Michigan, 2009, available at https://deepblue.lib.umich.edu/bitstream/handle/2027.42/64787/naraghi_1.pdf?sequence=1.

Ring oscillators may need frequent calibration during operation as their frequency changes with voltage or temperature. To reduce the calibration errors and eliminate the need for frequent calibration, some embodiments of the present invention lock the ring oscillator in a phase-locked loop (PLL) with a highly precise device such as a crystal oscillator circuit.

The invention is not limited to the features or advantages discussed above. Some embodiments include any one or more but not all of the features discussed above, and other features can be provided in addition to, or instead of, the features discussed above. Specifically, the invention is not limited to TOF, to a crystal oscillator, a ring oscillator, or a PLL. The invention is defined by the appended claims.

BRIEF DESCRIPTION OF THE DRAWINGS

FIGS. 1 and 2 are block diagrams of prior art TDCs.

FIG. 3 is a block diagram of laser distance sensor operation according to some embodiments of the present invention.

DESCRIPTION OF SOME EMBODIMENTS

The embodiments described in this section illustrate but do not limit the invention. The invention is defined by the appended claims.

Figure 4A:
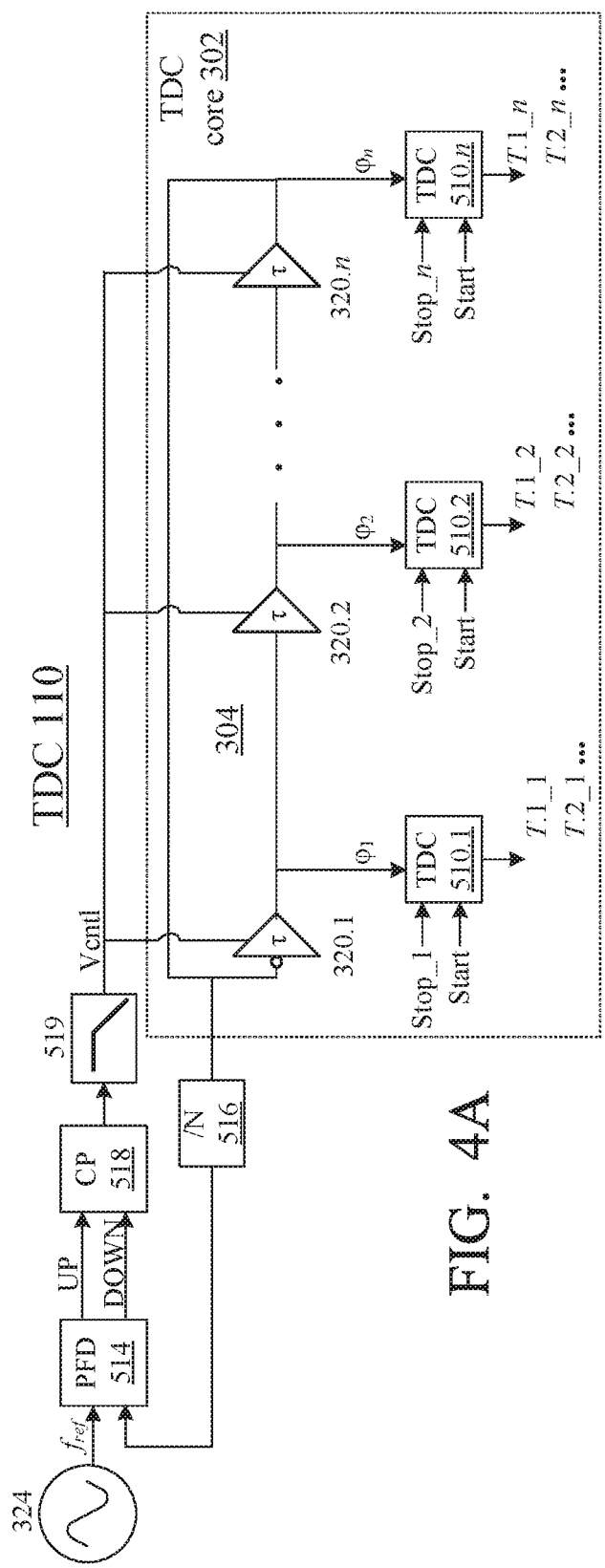
FIG. 4A is a block diagram of a TDC according to some embodiments of the present invention.
Figure 4B:
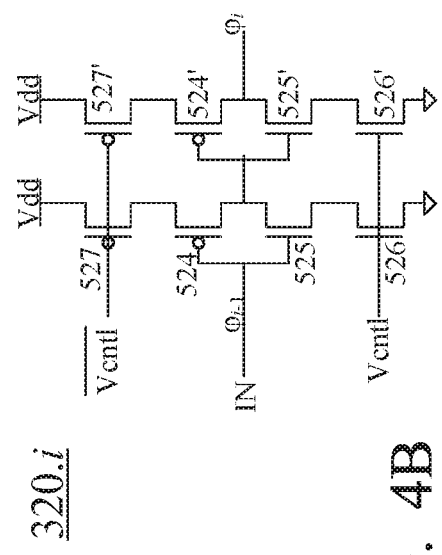
FIG. 4B is a circuit diagram of a ring oscillator buffer according to some embodiments of the present invention.

FIG. 4A is a block diagram of a multi-stop TDC 110 according to some embodiments of the present invention. FIG. 4B is a circuit diagram of a buffer 320 of FIG. 4B. TDC 110 receives a Start signal and some number n of stop signals Stop_1, Stop_2, . . . Stop_n.

Figure 5:
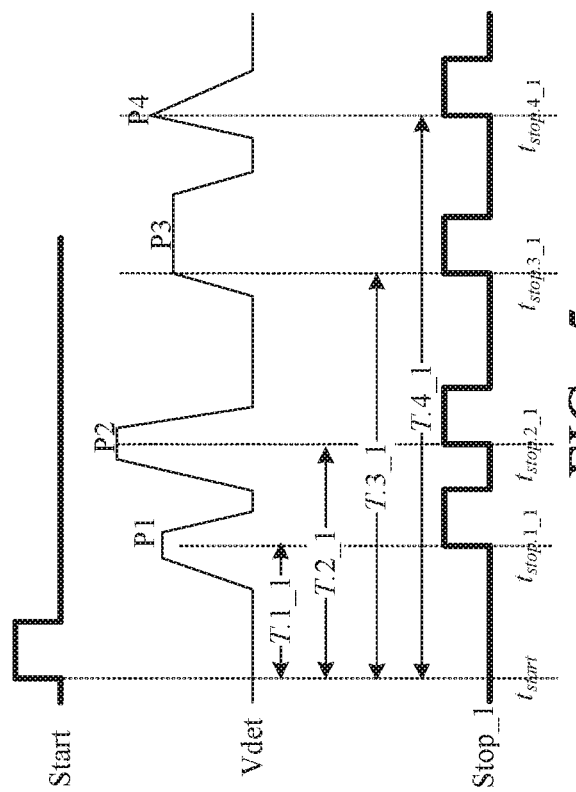
FIG. 5 is a timing diagram for some embodiments of the present invention.

FIG. 5 illustrates possible timing for signal Stop_1; other Stop signals can be similar. For example, in a TOF LDS, the signal Stop_1 may be asserted each time that the LDS detects an incoming light pulse. For ease of description, signals are assumed to be asserted on a rising edge, and de-asserted on a falling edge, unless made clear otherwise. But the invention is not limited to rising or falling edge assertion or deassertion. Also, signals can be analog or digital.

In FIG. 5, the Start signal is asserted at a time $t_{start}$. Then Stop_1 is first asserted at a time $t_{stop.1\_1}$. In a TOF LDS application, this may be the time when the LDS detects the first light pulse P1 of a voltage Vdet representing the detected light intensity.

Then Stop_1 is de-asserted, and is asserted again at a time $t_{stop.2\_1}$ (e.g. when the LDS detects the next light pulse P2); then de-asserted again, and is asserted again at a time $t_{stop.3\_1}$ (e.g. when the LDS detects the next light pulse P3); then de-asserted again, and is asserted again at a time $t_{stop.4\_1}$ (e.g. when the LDS detects the next light pulse P4). TDC 110 generates respective digital signals T.1_1, T.2_1, T.3_1, T.4_1 indicating the respective durations measured from the time $t_{start}$.

In the same manner, for every signal Stop_i, the TDC generates one or more time signals T.1_i, T2_i, etc.

The TDC 110 of FIGS. 4A-4B can be used in non-TOF applications.

As illustrated in FIG. 4A, TDC 110 includes a TDC core 302, shown in a dash box, which includes ring oscillator 304 of n serially connected buffers 320.1, 320.2, . . . , 320.n. The ring oscillator frequency is locked with crystal oscillator circuit 324 in a phase locked loop (PLL) described below.

Each buffer 320.i is a non-inverting buffer, though inverting buffers can also be used. The output of one of the buffers 320 (the last buffer 320.n in FIG. 4A) is inverted and connected to the input of buffer 320.1 to cause each buffer output $\varphi_i$ to oscillate. An oscillator cycle duration is n*τ, where τ is each buffer's delay. Each $\varphi_i$ signal has a period of 2n*τ.

Each stop signal Stop_i is provided to a corresponding TDC 510.i, which also receives the Start signal and the output $\varphi_i$ of corresponding buffer 320.i. In this embodiment, there are n Stop signals and n buffers 320. In other embodiments, the number of Stop signals differs from the number of buffers 320. Also, any TDC 510.i can be connected to any output $\varphi_j$. Further, any buffer output $\varphi_j$ can be connected to multiple TDCs 510 or to none at all. However, it may be desirable to distribute the TDCs 510 evenly among the $\varphi_j$ nodes to equalize the buffer 320 output capacitances and hence the buffer delays, as in FIG. 4A.

Each TDC 510.i generates the corresponding digital signals T.1_i, T.2_i, etc. representing the durations from the assertion of Start to different assertions of Stop_i:

$$T.1\_i = t_{stop.1\_i} - t_{start}$$

$$T.2\_i = t_{stop.2\_i} - t_{start}$$

and so on. (There may be only one Stop_i assertion.)

As noted above, ring oscillator 304 is synchronized with crystal oscillator circuit 324 (or some other circuit having high precision with regard to frequency) in a phase locked loop. Circuit 324 may be a conventional design, using a piezo-electric crystal (e.g. quartz). The PLL may be of any design, digital or analog. Just for illustration, the circuit 324 output, of some frequency $f_{ref}$, is provided to phase frequency detector 514, which is also coupled to one of nodes $\varphi_i$ (node $\varphi_n$ in FIG. 4A), possibly through a frequency divider 516. In this embodiment, $f_{ref}$ is equalized with the ring oscillator frequency divided by some number N, so the ring oscillator frequency is N*$f_{ref}$.

The UP and DOWN outputs of PFD 514 are connected to the inputs of charge pump 518, which generates a voltage Vcnt1 representing the desired frequency adjustment for ring oscillator 504. Low pass filter 519 filters out high frequency components of signal Vcnt1. The filtered voltage Vcnt1 is provided to each buffer 320. If Vcnt1 increases, the ring oscillator frequency is increased by reducing each buffer's delay τ.

FIG. 4B illustrates an exemplary circuit diagram of a buffer 320.i. The buffer's input IN receives the signal $\varphi_{i-1}$, and the buffer outputs the signal $\varphi_i$ (except that for i=1, the buffer 320.1 receives the inverse of $\varphi_n$ at the IN input). The buffer's IN input is connected to the gates of PMOS transistor 524 and NMOS transistor 525. Signal Vcnt1 is delivered to the gate of NMOS transistor 526, and the inverse of Vcnt1 to the gate of PMOS transistor 527. Transistors 527, 524, 525, 526 are connected in series, in that order. The source of PMOS 527 is connected to a power supply voltage "Vdd". The source of NMOS 526 is connected to ground. Other reference voltages can be used instead of ground or Vdd.

PMOS transistors 527' and 524', and NMOS transistors 525' and 526', are connected together identically to respective transistors 527, 524, 525, 526. The gates of transistors 524' and 525' are connected together and to the drains of transistors 524 and 525. The drains of transistors 524' and 525' provide the buffer output signal $\varphi_i$. See also U.S. pre-grant patent publication US 2017/0373697 A1, published Dec. 28, 2017 (inventors: Schober et al.), incorporated herein by reference.

The implementation of FIGS. 4A and 4B is exemplary and not limiting.

In some embodiments, the PLL design eliminates the need for frequent calibration otherwise needed during operation if the stage delay τ changes with temperature and voltages (such as Vdd). When locked to a PLL, the τ delay in the ring oscillator is locked across PVT (process, voltage, and temperature) variations:

$$\tau = \frac{1}{2n \cdot f_{ref} N} \tag{1}$$

Without a PLL, calibration is likely to involve an error Δτ between the true delay τ and calibrated delay $\tau_{cal}$ of each ring oscillator buffer 320. Each buffer's delay τ=$\tau_{cal}$+Δτ.

When measuring long durations, the errors Δτ accumulate, resulting in measurement inaccuracy. For example, for a 5-stage ring oscillator (n=5), if Δτ=10 ps, running the oscillator 1000 cycles would yield an error of 10 ps×(2×5)× 1000=100 ns. In TOF applications, 100 ns is equivalent to a measurement error of 15 meters. However, if the ring oscillator is locked in the PLL, then Δτ is practically zero.

Figure 6:
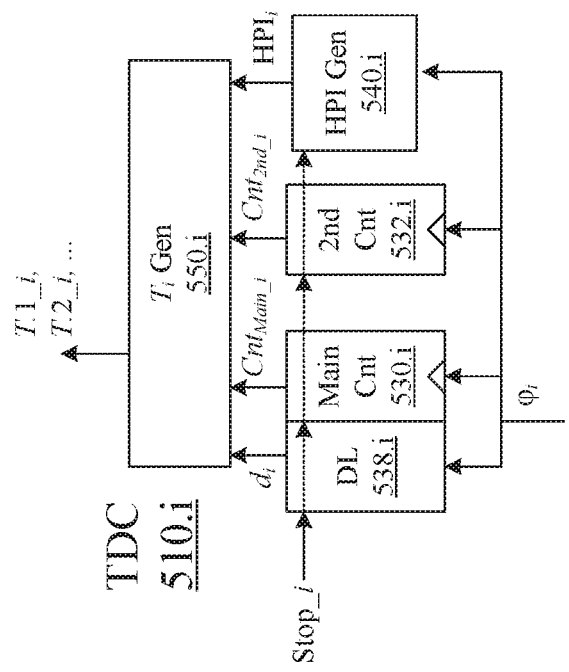
FIG. 6 is a block diagram of a TDC portion according to some embodiments of the present invention.
Figure 7:
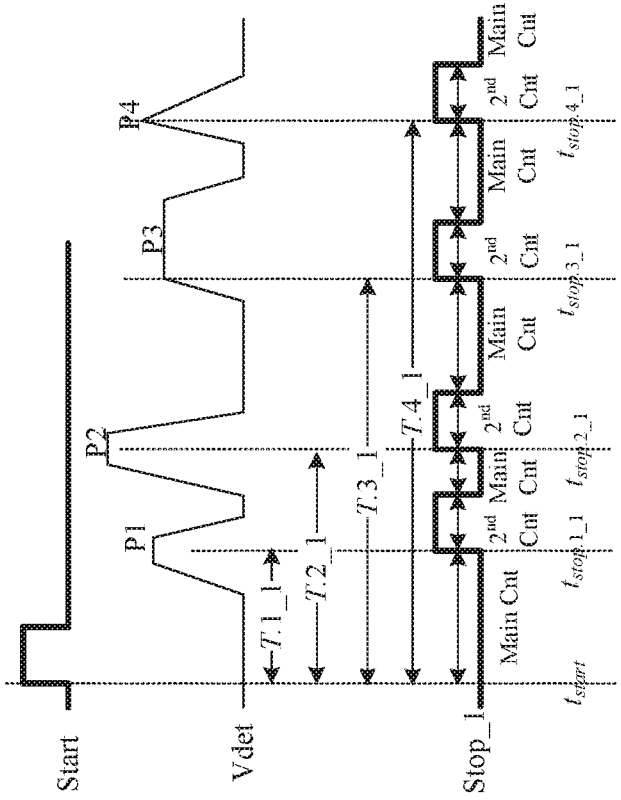
FIGS. 7, 8A, 8B are timing diagrams for some embodiments of the present invention.

FIG. 6 shows a TDC 510.$i$ implementation that can be used for some or all of TDCs 510 of FIG. 4A. TDC 510.$i$ of FIG. 6 includes a main counter 530.$i$, a secondary counter 532.$i$, and a delay line 538.$i$. Counters 530.$i$ and 532.$i$ count the rising edges of the corresponding buffer output signal $\varphi_i$. Only one of the two counters is active at any time, as illustrated in FIG. 7. FIG. 7 is identical to FIG. 5, except for the counter activity indication on the bottom. In this example, the counters are initialized to zero. The main counter 530.1 counts the $\varphi_i$ cycles from time $t_{start}$ until time $t_{stop.1\_1}$ (pulse P1). Then the main counter stops, and secondary counter 532.1 starts counting from zero until the time when Stop_1 goes low. Then the secondary counter stops, and the main counter resumes counting from its current value (reached at time $t_{stop.1\_1}$), and continues until the time $t_{stop.2\_1}$. Then the main counter stops, and the secondary counter resumes counting from its current value, and continues until the time when Stop_1 goes low again. And so on. Essentially, the main counter is active when Stop_1 is low; the secondary counter is active when Stop_1 is high.

Figure 8A:
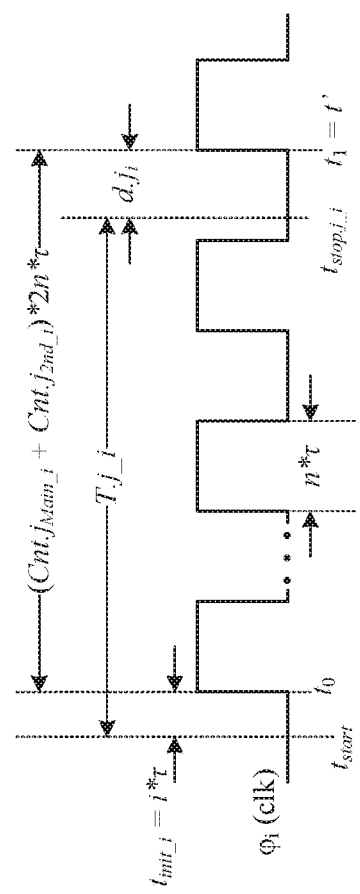
Figure 8B:
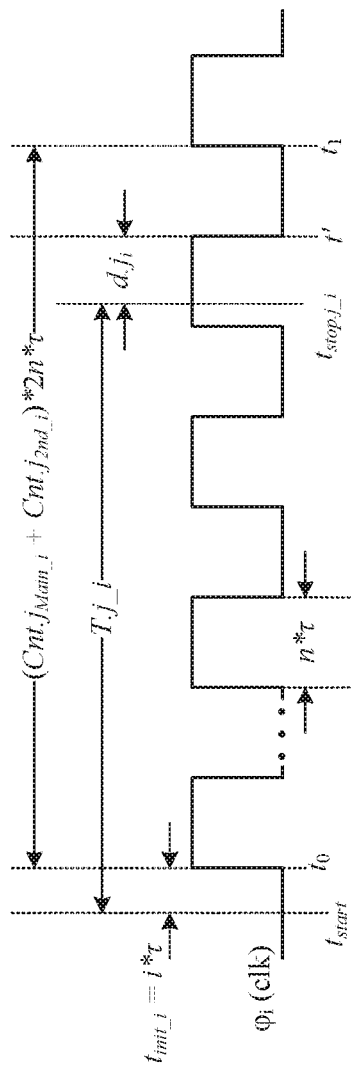

While the main counter is inactive, the delay line 538.1 resolves the difference between the corresponding Stop_i signal assertion and the next $\varphi_i$ edge (rising or falling), to obtain a finer T resolution than provided by the $\varphi_i$ edges, as illustrated in FIGS. 8A and 8B.

FIG. 8A is an exemplary timing diagram referenced to the $\varphi_i$ signal. This signal is also called "clock" or "clk". The time $t_0$ indicates the first incrementation (at a $\varphi_i$ rising edge) of main counter 530.$i$. This happens at the time $i*\tau$ after $t_{start}$. Signal Stop_i becomes asserted multiple times (FIGS. 5 and 7), and the jth assertion time is shown as $t_{stop.j\_i}$. Counters 530.$i$ and 532.$i$ provide the outputs $Cnt_{Main\_i}$ and $Cnt_{2nd\_i}$, whose values at the jth assertion of Stop_i are shown respectively as $Cnt.j_{Main\_i}$ and $Cnt.j_{2nd\_i}$ in FIGS. 8A and 8B. The sum of these values is the number of the $\varphi_i$ cycles from $t_{start}$ to the next $\varphi_i$ rising edge at or after $t_{stop.j\_i}$. This edge is shown as occurring at a time $t_1$.

For each assertion of Stop_i, delay line 538.$i$ measures the duration $d_i$ from $t_{stop.j\_i}$ to the next rising or falling $\varphi_i$ edge, which occurs at a time t'. For the jth assertion of Stop_i, the duration $d_i$ is sometimes denoted as $d.j_i$.

In FIG. 8A, the closest $\varphi_i$ edge after $t_{stop.j\_i}$ is a rising edge, so t'=$t_1$. In FIG. 8B, the closest $\varphi_i$ edge is a falling edge, so t' is less than $t_1$.

In FIG. 8A, $$T.j\_i = i*\tau + (Cnt.j_{Main\_i} + Cnt.j_{2nd\_i})*2n*\tau - d.j_i \quad (1)$$

In FIG. 8B, $$T.j\_i = i*\tau + (Cnt.j_{Main\_i} + Cnt.j_{2nd\_i} - \tfrac{1}{2})*2n*\tau - d.j_i \quad (2)$$

Circuit 540.$i$ (FIG. 6) generates a signal $HPI_i$ which helps determine whether the next (closest) $\varphi_i$ edge after $t_{stop.j\_i}$ is rising or falling, i.e. whether $\varphi_i$ is low or high when Stop_i is asserted:

$HPI_i=0$ if $\varphi_i$ is low when Stop_i is asserted (as in FIG. 8A);

$HPI_i=1$ if $\varphi_i$ is high when Stop_i is asserted (as in FIG. 8B).

Then the equations (1) and (2) can be combined into the following equation, executed by circuit 550.$i$:

$$T \cdot j\_i = i*\tau + \left(Cnt \cdot j_{Main\_i} + Cnt \cdot j_{2nd\_i} - \frac{HPI \cdot j_i}{2}\right)*2n*\tau - d \cdot j_i \quad (3)$$

where $HPI.j_i$ is the $HPI_i$ value at the jth assertion of $HPI_i$.

Figure 9:
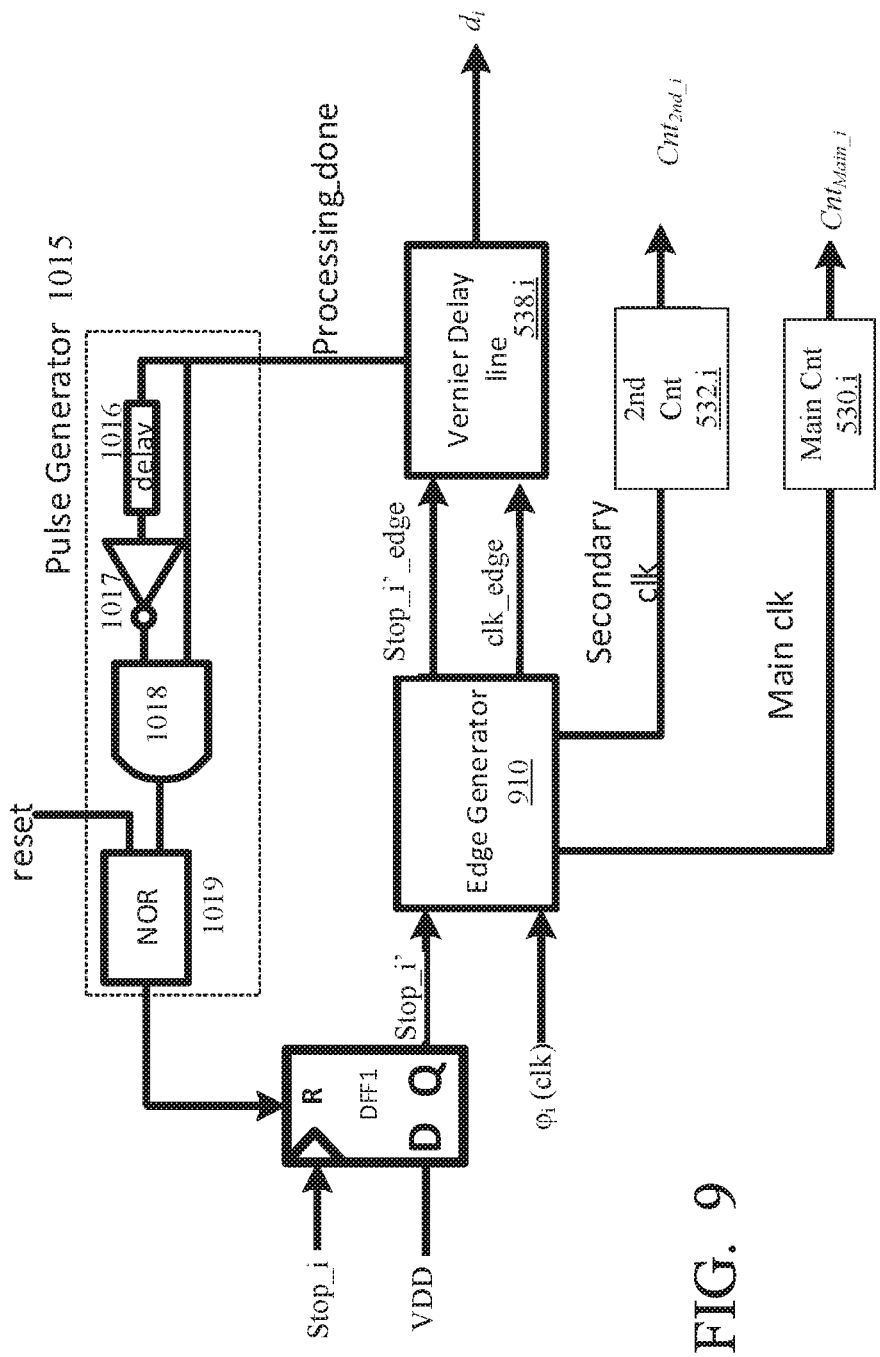
FIGS. 9 and 10 are block diagrams of TDC portions according to some embodiments of the present invention.
Figure 10:
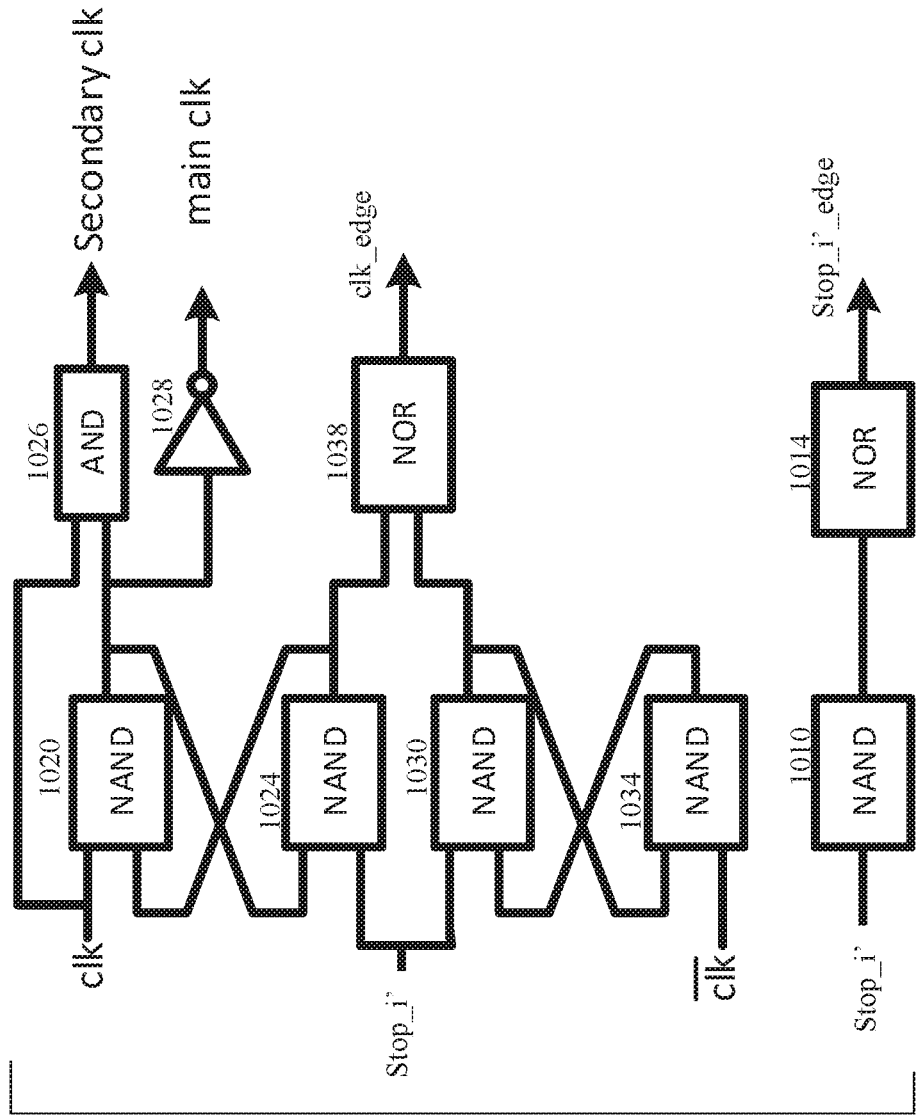
Figure 11:
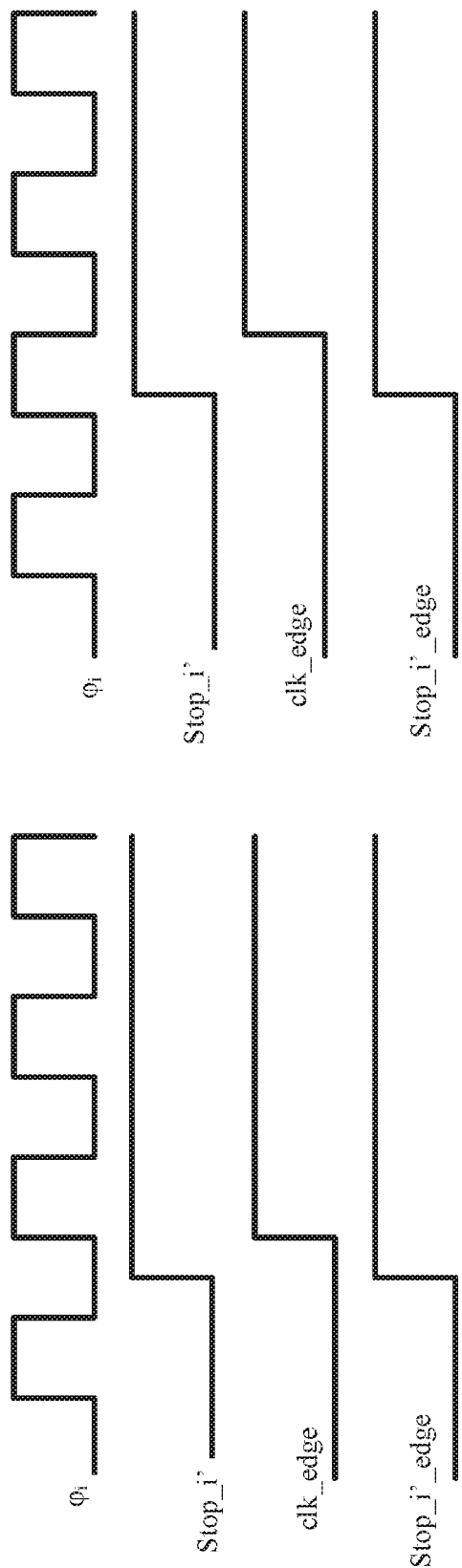
FIGS. 11A, 11B, 12 are timing diagrams for some embodiments of the present invention.

FIG. 9 shows a partial block diagram of a TDC 510.$i$, similar to FIG. 6 but with some modifications. Specifically, the $\varphi_i$ node is not connected to counters 530.$i$ and 532.$i$ directly, but is connected to the counters through an "edge generator" circuit 910 (called so because it generates some edge indicators as described below). One embodiment of edge generator 910 is shown in FIG. 10, and pertinent timing diagrams are shown in FIGS. 11A and 11B.

Referring to FIG. 9, signal Stop_i is provided to the clock input of data flip flop DFF1, which is reset (the Q output is driven to a low voltage) by a rising edge at the R input. The flip-flop's D input receives the high voltage VDD (e.g. power supply). The Q output signal is shown as Stop_i'. Stop_i' becomes high on the rising edge of Stop_i. Stop_i' and $\varphi_i$ are provided to edge generator 910, which generates the following signals (see FIGS. 11A, 11B):

1) Stop_i'_edge. This is simply a delayed version of Stop_i', delayed by NAND gate 1010 (FIG. 10) and NOR gate 1014 to match the delay of other outputs of edge generator 910. (Each of the gates 1010, 1014 has its two inputs tied together to logically act as an inverter.)

2) Clk_edge. This signal is asserted (rising edge) on the next edge (rising or falling) of $\varphi_i$ after Stop_i' assertion. FIG. 11A shows the timing when Stop_i' is asserted when $\varphi_i$ is low ($HPI_i=0$). FIG. 11B shows the timing when Stop_i' is asserted when $\varphi_i$ is high ($HPI_i=1$).

Figure 12:
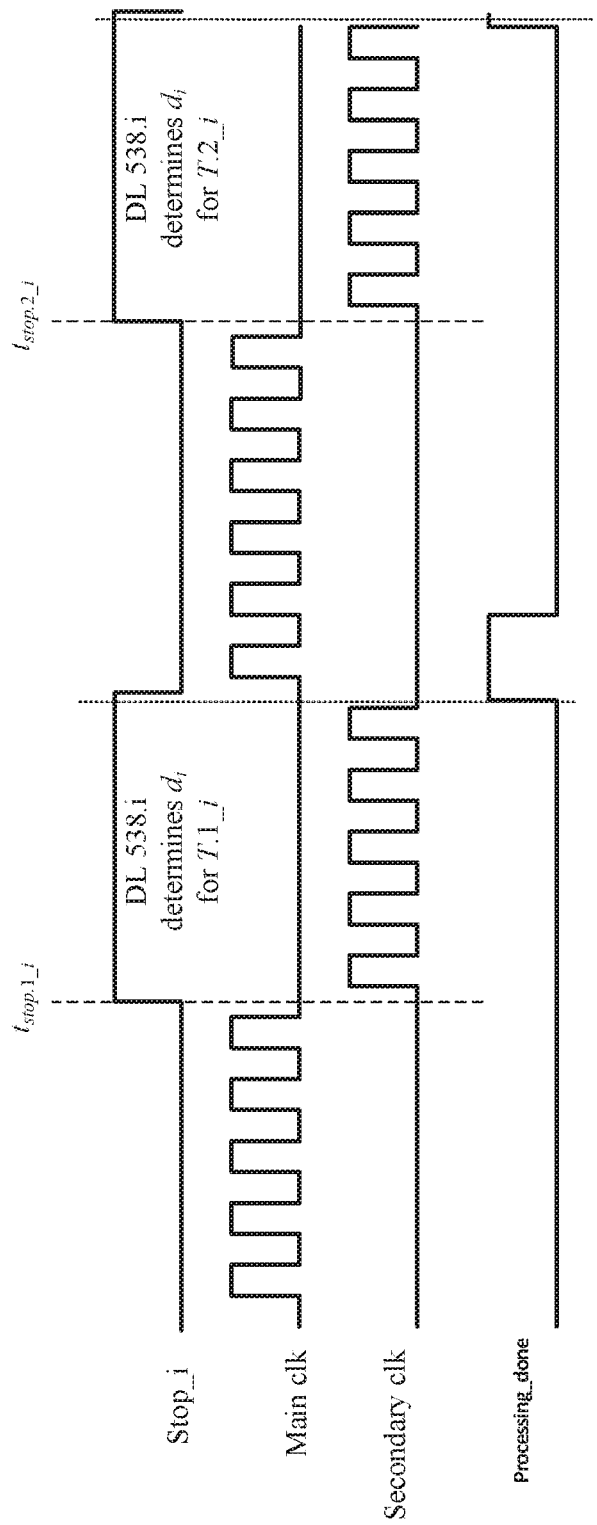

3) "Main clk". This is a $\varphi_i$ version that clocks the main counter 530.$i$; the main counter is incremented on each rising edge of Main clk. See FIG. 12.

4) "Secondary clk". This is a $\varphi_i$ version that clocks the secondary counter 532.$i$; the secondary counter is incremented on each rising edge of Secondary clk.

Vernier delay line circuit 538.$i$ determines the duration $d.j_i$ for each j. When $d.j_i$ has been determined, DL 538.$i$ asserts "Processing_done", which in turn causes the pulse generator 1015 to generate a high voltage pulse on the Reset input of flip-flop DFF1. As a result, Stop_i' becomes low. See FIG. 12.

In pulse generator 1015, signal Processing_done is delayed by a circuit 1016, and then inverted by inverter 1017, whose output is ANDed with Processing_done by gate 1018. The output of gate 1018 is NORed with a "reset" signal by gate 1019, whose output is connected to the R input of flip-flop DFF1. The "reset" signal is normally low, and is asserted high when all the T.j_i signals have been generated for all i and j.

Turning to FIG. 10, edge generator 910 includes cross-coupled NAND gates 1020 and 1024 (forming an RS flip-flop), which receive respectively the signals clk (i.e. $\varphi_i$) and Stop_i'. AND gate 1026 ANDs the output of NAND gate 1020 and the clk signal, providing Secondary clk as the result. Inverter 1028 inverts the output of gate 1020, providing Main clk.

Cross-coupled NAND gates 1030 and 1034 (forming an RS flip-flop) receive respectively Stop_i' and the inverse of clk. NOR gate 1038 NORs the outputs of NAND gates 1024 and 1030, providing clk_edge as the result.

Other edge generator implementations are possible, e.g. using NOR gates rather than AND gates.

Figure 13:
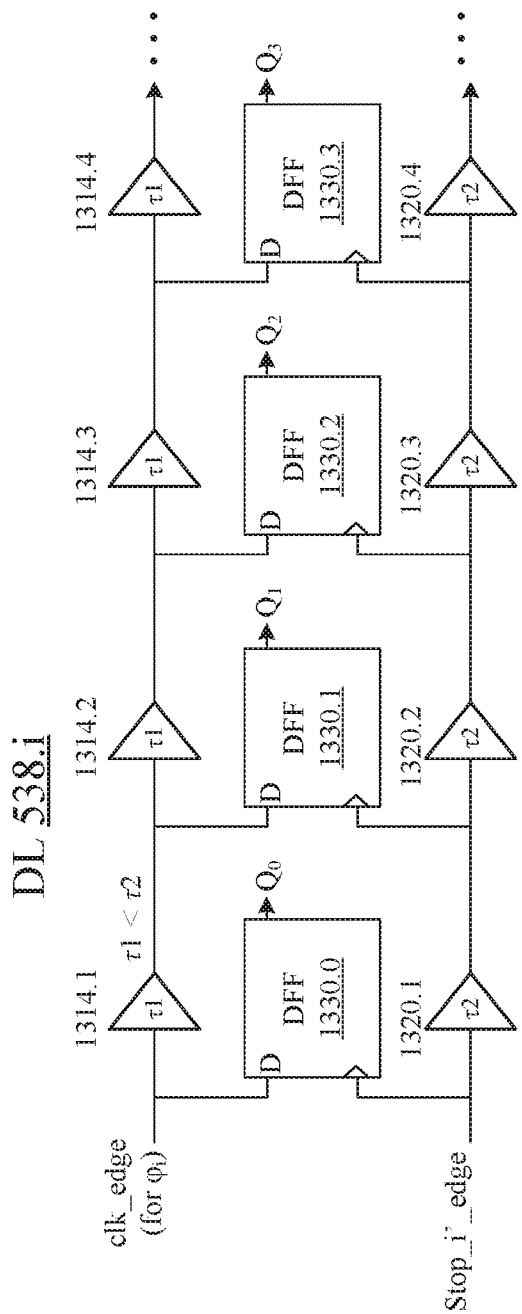
FIG. 13 is a block diagram of a Vernier delay line used in some embodiments of the present invention.

Delay line 538.*i* has a higher resolution than n*τ, enabling the d.j$_i$ signals to represent smaller intervals than τ. Many implementations of the delay line are possible, including conventional implementations. FIG. 13 shows a Vernier delay line implementation. Vernier delay line 538.*i* includes two chains of serially connected buffers. Buffer chain 1314 receives signal "clk_edge" (FIGS. 9, 10, 11A, 11B) generated for φ$_i$. The clk_edge is received at the input of the first buffer 1314.1. Buffer chain 1320 receives Stop_i'_edge (at the input of the first buffer 1320.1). Each buffer 1314.*k* has a propagation delay τ1, which is smaller than the delay τ2 of each buffer 1320.*k*.

The output of each buffer 1314.*k* is connected to the data input D of corresponding data flip flop (DFF) 1330.*k*, whose clock input is connected to the output of corresponding buffer 1320.*k*. Also, the signals clk_edge and Stop_i'_edge are provided, respectively, to the data and clock inputs of a data flip flop 1330.0. Each flip flop 1330.*k* passes the signal on its D input to its Q output Q$_k$ on the rising edge of the flip flop's clock input.

The clk_edge transitions propagate along the chain 1314, but are not latched by flip flops 1330 until a rising edge of Stop_i'_edge. The jth assertion of Stop_i'_edge begins the d.j$_i$ period (FIGS. 6, 8). The jth rising edge of signal Stop_i'_edge then propagates along the chain 1320. During this time, the clk_edge values on buffer 1314 outputs are latched by flip flops 1330. Since τ1 is smaller than τ2, the clk_edge signal propagates faster, so the latched clk_edge values represent the clk_edge level at the time $t_{stop\_j\_i}$, when Stop_i'_edge was asserted.

When clk_edge becomes high (at the end of time interval d.j$_i$), the high clk_edge level propagates and eventually catches up with Stop_i'_edge because τ1 is smaller than τ2. However, Stop_i'_edge remains high, so the new clk_edge value is not latched until this value overtakes the rising edge of Stop_i'_edge propagating along the chain 1320. The high clk_edge value becomes latched only by those flip flops 1330 which are reached by the Stop_i edge's rising edge before the new clk_edge value. As a result, the Q$_k$ outputs form a thermometer code for the duration d.j$_i$ from the Stop_i'_edge assertion to the next rising edge of clk_edge. The delay d.j$_i$ is thus:

$$d.j_i = k.j_i * (\tau 2 - \tau 1)$$

where k.j$_i$ is the number represented by the temperature code on the Q$_k$ outputs.

The total duration T.j_i (see equation (3) above) is:

$$T \cdot j\_i = i * \tau + \left( Cnt \cdot j_{Main\_i} + Cnt \cdot j_{2nd\_i} - \frac{HPI \cdot j_i}{2} \right) * 2n * \tau - k \cdot j_i * (\tau 2 - \tau 1) \quad (4)$$

The d.j$_i$ resolution is the difference τ2−τ1, which can be small even if τ1 and τ2 are large. The difference can be smaller than τ1 by a factor of 10 or more. This enables a TDC to be built in a relatively mature process such as 130 nm or 180 nm, yet still be able to achieve a very fine resolution that is less than 10 ps.

In some embodiments, τ1=τ, where τ is the delay of a buffer 320 (FIG. 4A), but this is not necessary.

Some embodiments use φ$_i$ and Stop_i' (or Stop_i) as inputs to VDL 538.*i* instead of clk_edge and Stop_i'_edge. However, there is a benefit in using the edge signals clk_edge and Stop_i'_edge, because the buffer chains 1314, 1320 each act as a low-pass filter. If the φ$_i$ or Stop_i frequency is high, the Vernier delay line would filter out the high frequency signal, possibly causing the TDC to fail. Because the edge signals are lower frequency, the Vernier delay line will never fail, and can have any number of buffer stages.

Figure 14:
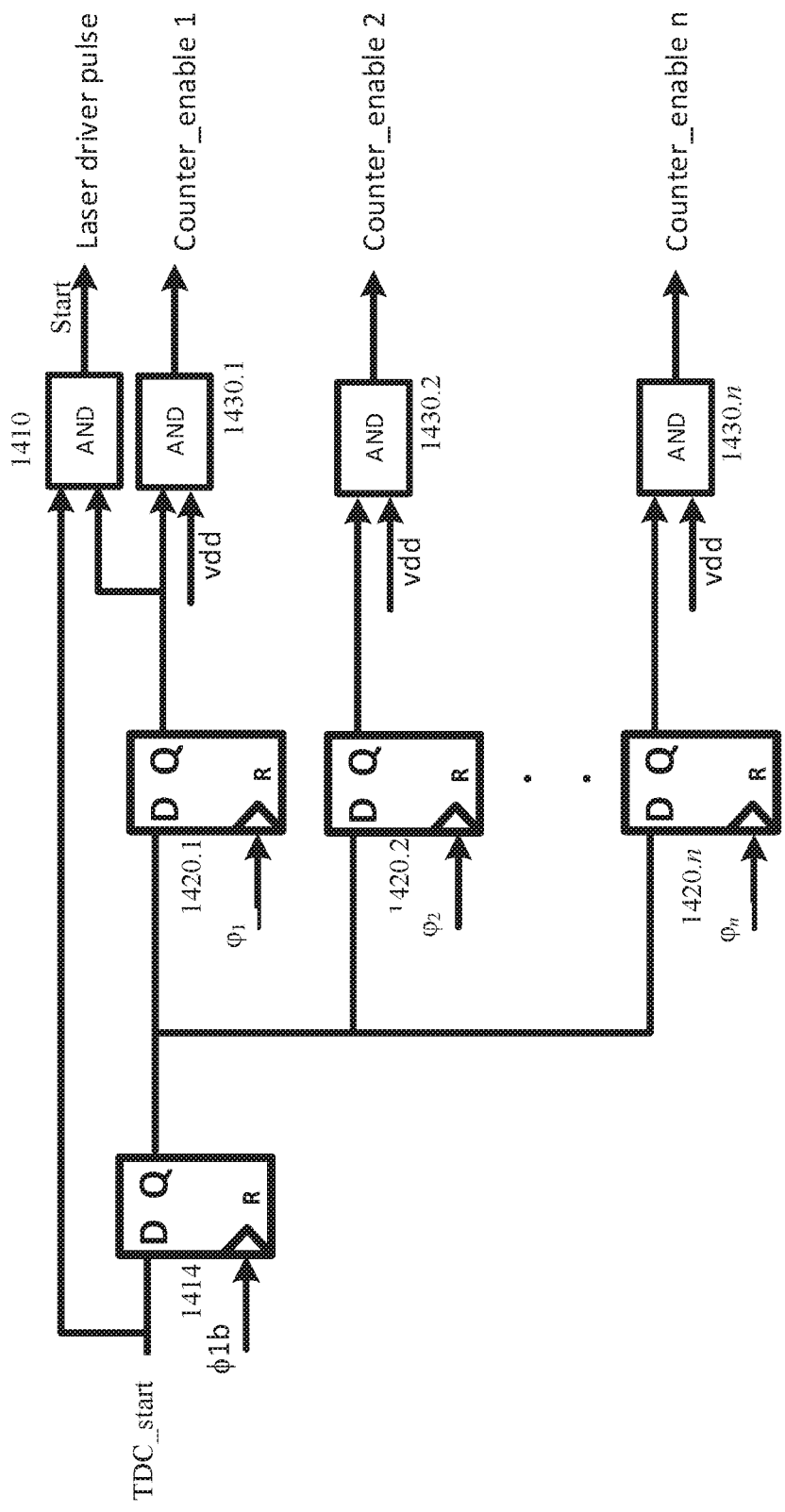
FIG. 14 is a block diagram of a TDC portion according to some embodiments of the present invention.
Figure 15:
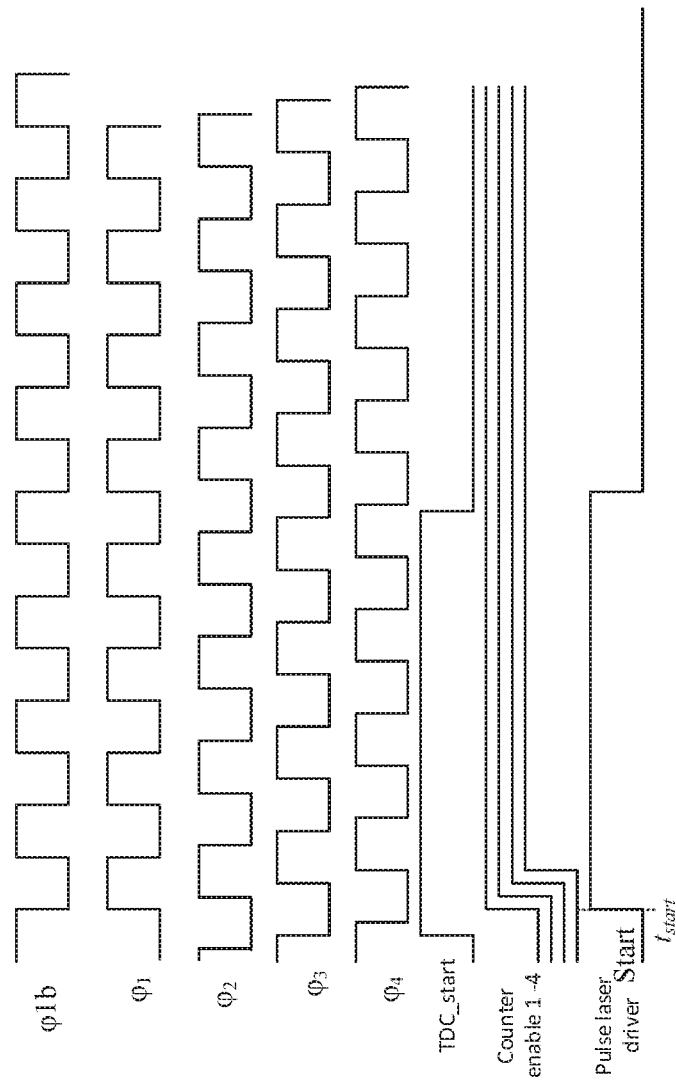
FIG. 15 is a timing diagram for some embodiments of the present invention.

FIG. 14 shows an exemplary circuit that synchronizes the Start signal and the counters 530 and 532 (FIG. 6). FIG. 15 is a timing diagram.

For each value i, counters 530.*i* and 532.*i* are enabled when the corresponding signal Counter_enable_i is high, and are disabled when the signal is low.

TDC_start is a start signal for the measurement. This signal is used to generate the Start signal at the output of AND gate 1410.

TDC_start is provided to the D input of data flip-flop (DFF) 1414, whose clock input receives the signal φ1b, which is the inverse of φ$_1$. The Q output of DFF 144 is connected to the D inputs of DFFs 1420.1 through 1420.*n*. The clock input of each DFF 1420.*i* receives the respective signal φ$_i$. All the DFFs are triggered by the rising edge of their clock input to transfer the D input to the Q output.

The Q output of each DFF 1420.*i* is connected to one input of respective AND gate 1430.*i*, which also receives the high voltage "vdd" on its other input and generates the corresponding signal Counter_enable_i on its output.

AND gate 1410 has one input receiving the signal TDC_start, and the other input connected to the Q output of DFF 1420.1. The output of AND gate 1410 provides the Start signal, which is also delivered to a laser driver for generating a laser pulse. (Alternatively, the Start signal can be delayed from the output of AND gate 1410 if needed to synchronize the laser pulse start with the Start signal.)

Figure 16:
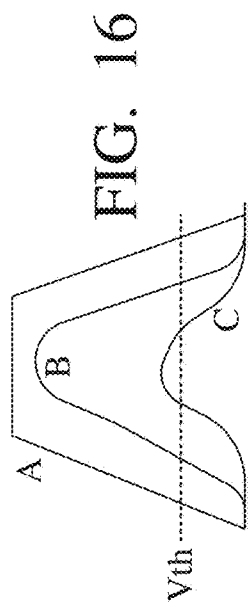
FIG. 16 is a timing diagram of a voltage signal obtained in some embodiments of the present invention.
Figure 17:
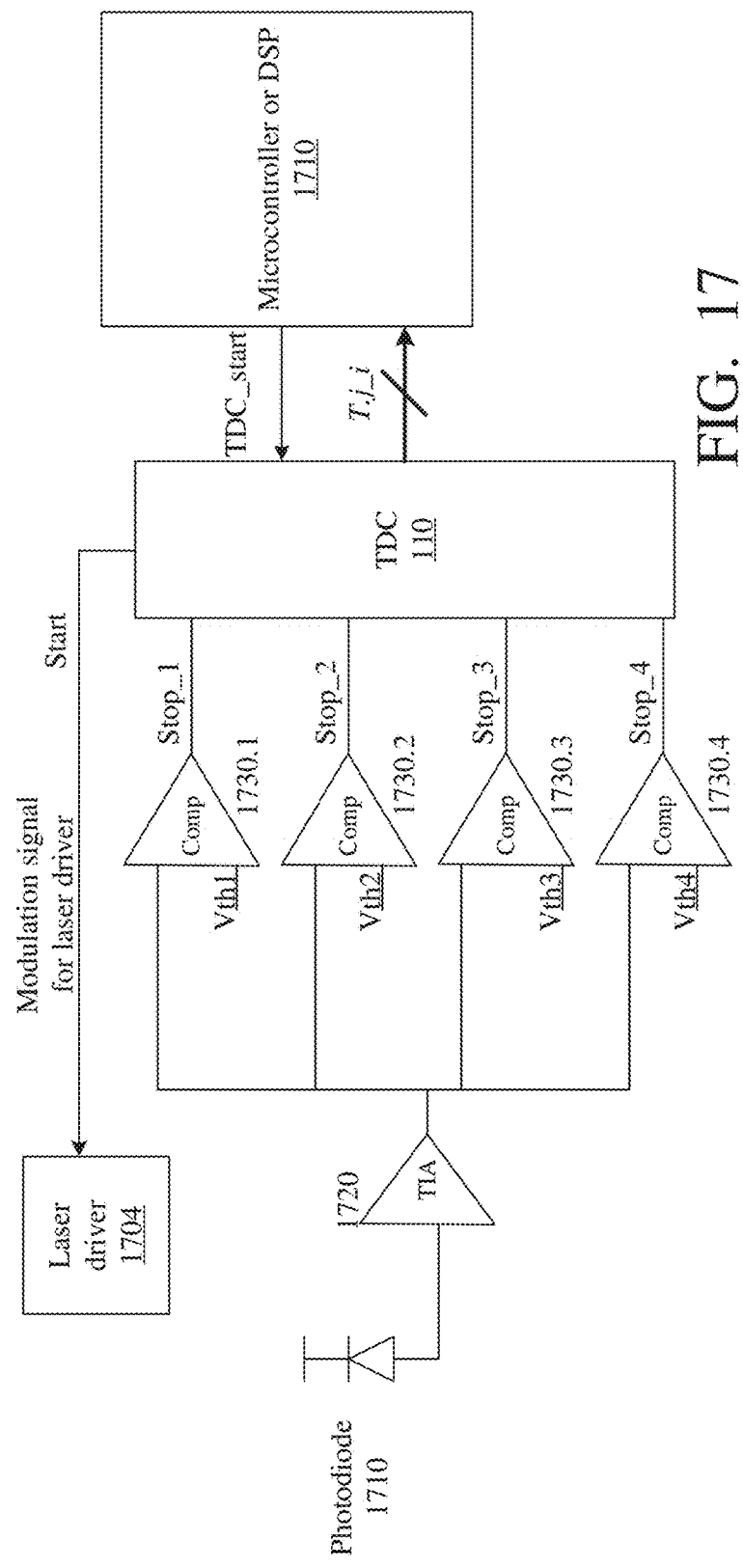
FIG. 17 is a block diagram of a TDC according to some embodiments of the present invention.

FIGS. 16 and 17 illustrate a possible multi-stop TDC application for a laser diode sensor as in FIG. 2. As noted above, a TDC is a key component in high-performance digital phase-locked loops (DPLL) and time of flight (TOF) applications. Multi-stop capability can be used in TOF systems as illustrated in FIG. 17. A laser (not shown, possibly a laser diode) driven by laser driver 1704 generates a light pulse at the assertion of the Start generated by TDC 110 (see FIG. 14) in response to the TDC_start signal from processor 1710 (e.g. microcontroller or DSP). The light pulse travels to an object (not shown). Reflected light is detected by a photodiode 1710, which generates electric current proportional to the light intensity. The current is amplified and converted to a voltage by transimpedance amplifier (TIA) 1720.

FIG. 16 illustrates possible voltage profiles output by TIA 1720. In single-stop applications, the TIA output voltage is thresholded to obtain a Stop signal, i.e. the Stop signal is asserted when this voltage crosses some predefined threshold Vth. However, the voltage profile depends on the reflected light, which in turn depends on the type of the reflecting material and environmental factors. The voltage waveform may look like any of the waveforms A, B or C. If Vth is chosen a very low value, then the TOF system will react to ambient light variations, and the TOF output duration may be too short. If Vth is too high, it may never be reached by the reflected signal, and the TOF output duration may be too high.

Therefore, some embodiments use multiple voltage thresholds Vth1, Vth2, etc., to generate multiple Stop signals Stop_1, Stop_2, etc. for the respective thresholds. FIG. 17 shows four thresholds Vth1, Vth2, Vth3, Vth4. The TIA output voltage is provided to four comparators 1730. Each comparator 1730.*i* compares the output voltage with a respective threshold, and generates a respective output signal Stop_i. The Stop_i signals are provided to a multi-stop TDC 110, which also receives the TDC_start signal and generates the time values T.j_i representing the duration to the time when the TIA output voltage crosses the respective threshold. The T.j_i outputs can be provided to processor 1710, or to other circuitry, for further processing. For example, if one of the T.j_i outputs, e.g. T.4_*i*, is too long, and another T.j_i is too short, the microcontroller may pick some other T.j_i which lies in a reasonable expected range, and provide output as the true time of flight.

Some embodiments are single-stop TDCs, i.e. n=1.

Some embodiments are defined by the following clauses.

Clause 1. A method for automatically measuring one or more event durations of respective one or more events, the method comprising performing, by an apparatus, at least one event duration measurement which comprises, for a respective event:

obtaining a start indication (e.g. Start signal assertion) indicating a starting time of the event;

obtaining a stop signal responsive to the event, wherein each assertion of the stop signal indicates a possible stop of the event;

for each assertion of the stop signal, generating a corresponding duration signal (e.g. T.j_i) specifying a duration from the starting time to the assertion.

2. The method of clause 1 wherein the stop signal is asserted more than once during the measurement.

3. The method of clause 2 further comprising selecting, by the apparatus (e.g. by processor 1710), one of the duration signals to represent a duration of the event.

4. The method of any preceding clause wherein the method is performed for multiple events all of which start at the starting time, with a separate stop signal for each event.

5. The method of any preceding clause wherein generating said corresponding duration signal comprises, during the duration measurement:

operating a ring oscillator synchronously with a crystal oscillator operated at a predetermined frequency;

counting oscillations of an output signal (e.g. $\varphi_i$) of a stage (e.g. 320.*i*) of the ring oscillator, to determine a number of the oscillations between the starting time and one or more assertions of the stop signal during the measurement; and measuring, by a delay line, a duration between at least one assertion and a transition of the output signal.

6. The method of clause 5 further comprising generating a transition indication (e.g. clk_edge) responsive to an assertion of the stop signal, the transition indication signaling a transition of the output signal;

wherein the delay line measures said duration between at least one assertion and a transition of the output signal by measuring the duration between said at least one assertion and the transition indication.

7. The method of clause 5 or 6 wherein the delay line measures said duration between at least one assertion and a transition of the output signal for each of two consecutive assertions.

8. The method of clause 5, 6, or 7, wherein the counting is performed by a plurality of counters (e.g. 530.*i*, 532.*i*) operating during consecutive time intervals, each time interval being a time interval between the starting time and an earliest assertion or a time interval between two consecutive assertions (see FIG. 7 for example);

wherein at most one of the counters counts the oscillations in each said time interval, and different counters count in at least two consecutive time intervals;

the method comprising, for at least one assertion, adding output counts of the counters by the apparatus (e.g. by circuit 550.*i*) to generate the corresponding duration signal.

9. An apparatus comprising a circuit for measuring event durations, the circuit comprising a duration signal generator (e.g. TDC 110) for:

obtaining a start indication indicating a starting time of an event;

obtaining a stop signal responsive to the event, wherein each assertion of the stop signal indicates a possible stop of the event;

for each assertion of the stop signal, generating a corresponding duration signal (e.g. T.j_i) specifying a duration from the starting time to the assertion.

10. The apparatus of clause 9 wherein the duration signal generator is operable to obtain a separate stop signal for each of a plurality of events starting at the starting time, each stop signal being responsive to its respective event, wherein for each stop signal, each assertion of the stop signal indicates a possible stop of the respective event;

wherein the duration signal generator is operable to generate, for each assertion of each stop signal, a corresponding duration signal specifying a duration from the starting time to the assertion.

11. The apparatus of clause 9 wherein the duration signal generator comprises:

a ring oscillator;

a crystal oscillator coupled to the ring oscillator, to cause the ring oscillator to operate at a predetermined frequency;

a counting circuit (e.g. 530, 532) for counting oscillations of an output signal (e.g. $\varphi_i$) of a stage (e.g. 320.*i*) of the ring oscillator between the starting time and one or more assertions of the stop signal during the measurement; and a delay line for measuring a duration between at least one assertion and a transition of the output signal.

12. The apparatus of clause 11 further comprising a transition indication generator (e.g. 910) for generating a transition indication (e.g. clk_edge) responsive to an assertion of the stop signal, the transition indication signaling a transition of the output signal;

wherein the delay line is configured to receive the transition indication and to measure said duration between at least one assertion and a transition of the output signal by measuring the duration between said at least one assertion and the transition indication.

13. The apparatus of clause 11 or 12 wherein the delay line is operable to measure the duration between each of at least two consecutive assertions and a respective transition of the output signal.

14. The apparatus of clause 13 wherein the counting circuit comprises a plurality of counters configured to have at most one of the counters counting the oscillations during a time interval between the starting time and an earliest assertion and during a time interval between two consecutive assertions, with different counters counting during at least two respective different time intervals;

wherein the apparatus further comprises an adder (550.*i*) for adding the counters' outputs to generate the corresponding duration signal.

15. An apparatus comprising a circuit for measuring event durations, the circuit comprising:

a clock signal generator (e.g. 320.*i* that generates the $\varphi_i$ clock);

a plurality of counters for counting clock cycles of the clock signal (e.g. $\varphi_i$) in response to a start indication indicating a starting time of an event, and for providing output counts;

wherein the plurality of counters are responsive to consecutive stop indications, each stop indication being an electrical indication of a possible stop of the event, wherein each counter is configured to stop counting at a respective stop indication while another counter is configured to start counting at the stop indication;

wherein the circuit further comprises an adder (e.g. 550.$i$) for adding output counts provided by respective counters to generate the event duration.

16. The apparatus of clause 15 further comprising a delay line for measuring a duration between at least one stop indication and an end of a clock cycle.

17. The apparatus of clause 16 wherein the delay line is configured to measure a duration between each stop indication and an end of a clock cycle proximate to the stop indication.

18. The apparatus of clause 17 wherein the delay line is responsive to the clock signal and the stop indication.

Other embodiments are within the scope of the invention, as defined by the appended claims.

The invention claimed is:

1. A method for automatically measuring one or more event durations of respective one or more events, the method comprising performing, by an apparatus, at least one event duration measurement which comprises, for a respective event:
    obtaining a start indication indicating a starting time of the event;
    obtaining a stop signal responsive to the event, wherein the stop signal is asserted more than once during the measurement, and each assertion of the stop signal is a true indication or a false indication of a stop of the event;
    for each assertion of the stop signal, regardless of whether the assertion is a true indication or a false indication of the stop of the event, generating a corresponding duration signal specifying a duration from the starting time to the assertion.

2. The method of claim 1 wherein at least one assertion of the stop signal is a true indication of the stop of the event, and every other assertion of the stop signal is a false indication of the stop of the event.

3. The method of claim 1 further comprising selecting, by the apparatus, one of the duration signals to represent a duration of the event.

4. The method of claim 1 wherein the method is performed for multiple events all of which start at the starting time, with a separate stop signal for each event.

5. The method of claim 1 wherein generating said corresponding duration signal comprises, during the duration measurement:
    operating a ring oscillator synchronously with a crystal oscillator operated at a predetermined frequency;
    counting oscillations of an output signal of a stage of the ring oscillator, to determine a number of the oscillations between the starting time and one or more assertions of the stop signal during the measurement; and
    measuring, by a delay line, a duration between at least one assertion and a transition of the output signal.

6. The method of claim 5 further comprising generating a transition indication responsive to an assertion of the stop signal, the transition indication signaling a transition of the output signal;

wherein the delay line measures said duration between at least one assertion and a transition of the output signal by measuring the duration between said at least one assertion and the transition indication.

7. The method of claim 5 wherein the delay line measures said duration between at least one assertion and a transition of the output signal for each of two consecutive assertions.

8. The method of claim 7 wherein the counting is performed by a plurality of counters such that for each stop indication, regardless of whether the stop indication is a true indication or a false indication, at least one counter is configured to stop counting at the stop indication and at least one other counter is configured to start counting at the stop indication;
    wherein at most one of the counters counts the oscillations at any time;
    the method comprising, for at least one assertion, adding output counts of the counters by the apparatus to generate the corresponding duration signal.

9. An apparatus comprising a circuit for measuring event durations, the circuit comprising a duration signal generator for:
    obtaining a start indication indicating a starting time of an event;
    obtaining a stop signal responsive to the event, wherein each assertion of the stop signal is a true indication or a false indication of a stop of the event;
    regardless of whether the stop signal is asserted only once or more than once to provide a true or false indication of the stop of the event, for each assertion of the stop signal, generating a corresponding duration signal specifying a duration from the starting time to the assertion.

10. The apparatus of claim 9 wherein the duration signal generator is operable to obtain a separate stop signal for each of a plurality of events starting at the starting time, each stop signal being responsive to its respective event, wherein for each stop signal, each assertion of the stop signal is a true indication or a false indication of a stop of the respective event;
    wherein the duration signal generator is operable to generate, for each assertion of each stop signal, a corresponding duration signal specifying a duration from the starting time to the assertion regardless of whether the stop signal is asserted only once or more than once to provide a true or false indication of the stop of the respective event.

11. The apparatus of claim 9 wherein the duration signal generator comprises:
    a ring oscillator;
    a crystal oscillator coupled to the ring oscillator, to cause the ring oscillator to operate at a predetermined frequency;
    a counting circuit for counting oscillations of an output signal of a stage of the ring oscillator between the starting time and one or more assertions of the stop signal during the measurement; and
    a delay line for measuring a duration between at least one assertion and a transition of the output signal.

12. The apparatus of claim 11 further comprising a transition indication generator for generating a transition indication responsive to an assertion of the stop signal, the transition indication signaling a transition of the output signal;
    wherein the delay line is configured to receive the transition indication and to measure said duration between at least one assertion and a transition of the output signal by measuring the duration between said at least one assertion and the transition indication.

13. The apparatus of claim 11 wherein the delay line is operable to measure the duration between each of at least two consecutive assertions and a respective transition of the output signal.

14. The apparatus of claim 13 wherein the counting circuit comprises a plurality of counters configured to have at most one of the counters counting the oscillations during a time interval between the starting time and an earliest assertion and during a time interval between two consecutive assertion/de-assertion events each of which is an assertion or a de-assertion of the stop signal, with different counters counting during at least two respective different time intervals;
wherein the apparatus further comprises an adder for adding the counters' outputs to generate the corresponding duration signal.

15. An apparatus comprising a circuit for measuring event durations, the circuit comprising:
a clock signal generator;
a plurality of counters for counting clock cycles of the clock signal in response to a start indication indicating a starting time of an event, and for providing output counts;
wherein the plurality of counters are responsive to consecutive stop indications, each stop indication being an electrical indication which is a true indication or a false indication of a stop of the event, wherein for each stop indication, regardless of whether the stop indication is a true indication or a false indication, at least one counter is configured to stop counting at the stop indication and at least one other counter is configured to start counting at the stop indication;
wherein the circuit further comprises an adder for adding output counts provided by respective counters to generate the event duration.

16. The apparatus of claim 15 further comprising a delay line for measuring a duration between at least one stop indication and an end of a clock cycle.

17. The apparatus of claim 16 wherein the delay line is configured to measure a duration between each stop indication and an end of a clock cycle proximate to the stop indication.

18. The apparatus of claim 17 wherein the delay line is responsive to the clock signal and the stop indication.

19. The method of claim 1, wherein the event starts with emitting light towards an object, and ends with receiving light reflected by the object receiving the emitted light.

20. The apparatus of claim 9, wherein the event starts with emitting light towards an object, and ends with receiving light reflected by the object receiving the emitted light, and wherein the apparatus comprises:
a light emitter for emitting light towards the object;
a light receiver for receiving light; and
circuitry for generating the stop signal, the circuitry asserting the stop signal when the received light meets predefined criteria.

* * * * *